United States Patent
Ishikawa

(10) Patent No.: US 11,266,051 B2
(45) Date of Patent: Mar. 1, 2022

(54) COMPONENT MOUNTING MACHINE

(71) Applicant: FUJI CORPORATION, Chiryu (JP)

(72) Inventor: Kazuma Ishikawa, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/980,255

(22) PCT Filed: Mar. 12, 2018

(86) PCT No.: PCT/JP2018/009590
§ 371 (c)(1),
(2) Date: Sep. 11, 2020

(87) PCT Pub. No.: WO2019/175945
PCT Pub. Date: Sep. 19, 2019

(65) Prior Publication Data
US 2021/0037687 A1 Feb. 4, 2021

(51) Int. Cl.
*B23P 19/00* (2006.01)
*H05K 13/08* (2006.01)
*H05K 13/04* (2006.01)

(52) U.S. Cl.
CPC ..... *H05K 13/0812* (2018.08); *H05K 13/0409* (2018.08); *Y10T 29/53178* (2015.01)

(58) Field of Classification Search
CPC .... H01L 21/486; H05K 13/0815; H05K 3/30; Y10T 29/53178; Y10T 29/4913;
(Continued)

(56) References Cited

U.S. PATENT DOCUMENTS

| 10,721,847 B2 * | 7/2020 | Hoshikawa | H05K 13/0409 |
| 10,820,458 B2 * | 10/2020 | Nishiyama | H05K 13/0404 |
| 2010/0229380 A1 | 9/2010 | Endo et al. | |

FOREIGN PATENT DOCUMENTS

| WO | WO 2017/009931 A1 | 1/2017 |
| WO | WO 2017/013703 A1 | 1/2017 |
| WO | WO 2017/068661 A1 | 4/2017 |

OTHER PUBLICATIONS

International Search Report dated May 29, 2018 in PCT/JP2018/009590 filed on Mar. 12, 2018, 2 pages.

* cited by examiner

*Primary Examiner* — Thiem D Phan
(74) *Attorney, Agent, or Firm* — Oblon, McClelland, Maier & Neustadt, L.L.P.

(57) ABSTRACT

A component mounting machine includes a tool station and a determination section. The tool station detachably accommodates a holding member including a main body section which can hold a component to be mounted on a board and multiple identification sections which can identify multiple accommodation angles. The determination section determines an angle difference in which the accommodation angle of the holding member differs from a predetermined accommodation angle. At least one identification section of the multiple identification sections is defined as a first identification section, the at least one identification section being exposed when the accommodation angle of the holding member is the predetermined accommodation angle in a close state in which the multiple identification sections are partially covered by a shielding member. When the determination section cannot recognize the first identification section in the close state, the determination section attempts to recognize a second identification section.

8 Claims, 4 Drawing Sheets

(58) Field of Classification Search
CPC ......... Y10T 29/53187; Y10T 29/49137; Y10T 29/53022; Y10T 29/53065; Y10T 29/53235; G05B 2219/36195
USPC .......... 29/740, 593, 729, 739, 743, 829, 833
See application file for complete search history.

COMPONENT MOUNTING MACHINE

TECHNICAL FIELD

The present description discloses a technique relating to a component mounting machine.

BACKGROUND ART

A component mounting machine described Patent Literature 1 includes a nozzle station in which multiple suction nozzles, which can be exchanged for a suction nozzle held on a rotary head, are arranged in multiple rows. Specifically, each of the multiple suction nozzles includes a flange section in which one cutout is provided. In addition, in the nozzle station, one fixing pin is provided in an accommodation position for each of the multiple suction nozzles. Each of the multiple suction nozzles is detachably accommodated in the nozzle station in such a state that one cutout fits on the fixing pin. That is, an accommodation angle of the suction nozzle in the nozzle station is determined uniquely.

PATENT LITERATURE

Patent Literature 1: WO-A-2017/013703

BRIEF SUMMARY

Technical Problem

In a tool station for accommodating detachably a holding member for holding a component to be mounted on a circuit board, however, there may be a case in which the holding member can be accommodated at multiple accommodation angles. In the case that the holding member is accommodated at an accommodation angle which differs from a predetermined accommodation angle, it increases likelihood of failing to remove the holding member properly and to mount a component properly, therefore the component mounting machine needs to recognize an angle difference in which the accommodation angle of the holding member differs from the predetermined accommodation angle.

In view of these situations, the present description discloses a component mounting machine capable of determining an angle difference in which an accommodation angle of a holding member accommodated in a tool station differs from a predetermined accommodation angle.

Solution to Problem

The present description discloses a first component mounting machine including a tool station and a determination section. The tool station detachably accommodates a holding member including a main body section which can hold a component to be mounted on a board and multiple identification sections which can identify multiple accommodation angles. The determination section determines an angle difference of the accommodation angle of the holding member different from a predetermined accommodation angle. At least one identification section of the multiple identification sections is defined as a first identification section, in which the at least one identification section is exposed when the accommodation angle of the holding member is the predetermined accommodation angle in a close state in which a part of the multiple identification sections is covered by a shielding member. At this time, when the determination section cannot recognize the first identification section in the close state, the determination section attempts to recognize a second identification section, which is at least one identification section of the multiple identification sections different from the first identification section, and determines the angle difference when the determination section has been able to recognize the second identification section in the close state.

In addition, the present description discloses a second component mounting machine including a tool station and a determination section. The tool station detachably accommodates a holding member including a main body section which can hold a component to be mounted on a board and at least one identification section which can identify multiple accommodation angles. The determination section determines an angle difference of the accommodation angle of the holding member different from a predetermined accommodation angle. In a close state in which at least a part of the at least one identification section is covered by a shielding member, a first identification section is defined by the at least one identification section that is exposed when the accommodation angle of the holding member is the predetermined accommodation angle. As this occurs, when the determination section cannot recognize the first identification section in the close state, the determination section attempts to recognize the first identification section by shifting the close state to the open state, in which covering the part of the identification section by the shielding member is released, and if the determination section can recognize the first identification section in the open state, the determination section determines the angle difference.

Advantageous Effects

With the first component mounting machine, the determination section attempts to recognize the second identification section when it cannot recognize the first identification section in the close state, and determines the angle difference when it can recognize the second identification section in the close state. With the second component mounting machine, the determination section attempts to recognize the first identification section by shifting the close state to the open state when it cannot recognize the first identification section in the close state, and determines the angle difference when it can recognize the first identification section in the open state. In either of the component mounting machines, the determination section can determine the angle difference of the accommodation angle of the holding member accommodated in the tool station, of which angle being different from the predetermined accommodation angle.

BRIEF DESCRIPTION OF DRAWINGS

FIG. 7 is a plan view showing an example of forming accommodation recessed section 17a.

DESCRIPTION OF EMBODIMENTS

1. First Embodiment 1-1. Configuration Example of Component Mounting Machine 10

Figure 1:
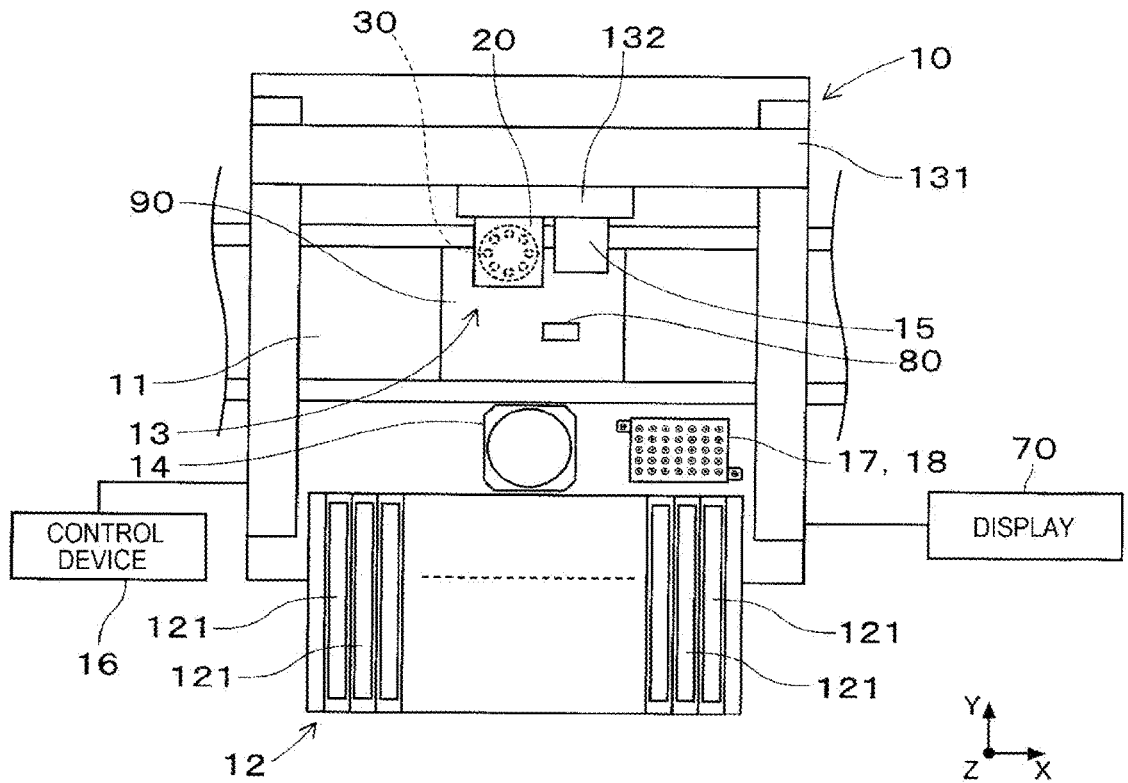
FIG. 1 is a plan view showing a configuration example of component mounting machine 10.

As shown in FIG. 1, component mounting machine 10 includes board conveyance device 11, component supply device 12, component transfer device 13, part camera 14, board camera 15, control device 16, and tool station 17. Board conveyance device 11 is made up, for example, of a belt conveyor or the like and conveys board 90 in a conveyance direction (an X-axis direction). Board 90 is a circuit board which is formed of an electronic circuit or an electrical circuit. Board conveyance device 11 conveys board 90 into component mounting machine 10 and positions board 90 in a predetermined position in component mounting machine 10. Board conveyance device 11 conveys board 90 out of component mounting machine 10 after component mounting machine 10 finishes a mounting process of component 80.

Component supply device 12 supplies component 80 to be mounted on board 90. Component supply device 12 includes multiple feeders 121 provided along the conveyance direction (the X-axis direction) of board 90. Each of multiple feeders 121 moves a carrier tape on which multiple components 80 are accommodated, so that components 80 can individually be picked up in a supply position located at a distal end portion of feeder 121. Additionally, component supply device 12 may supply relatively large electronic components (for example, a lead component) compared with a chip component in such a state that the relatively large electronic components are arranged on a tray.

Component transfer device 13 includes head driving device 131 and moving table 132. Head driving device 131 is configured so as to move moving table 132 in the X-axis direction and a Y-axis direction by use of a linear motion mechanism. Component mounting head 20 is detachably (in a replaceable fashion) provided on moving table 132 by use of a clamping member (not shown). Component mounting head 20 picks up (holds) component 80 supplied by component supply device 12 by use of at least one holding member 30 and mount component 80 so picked up on board 90 which is positioned by board conveyance device 11. For example, a suction nozzle, a chuck, or the like can be used for holding member 30.

Figure 2:
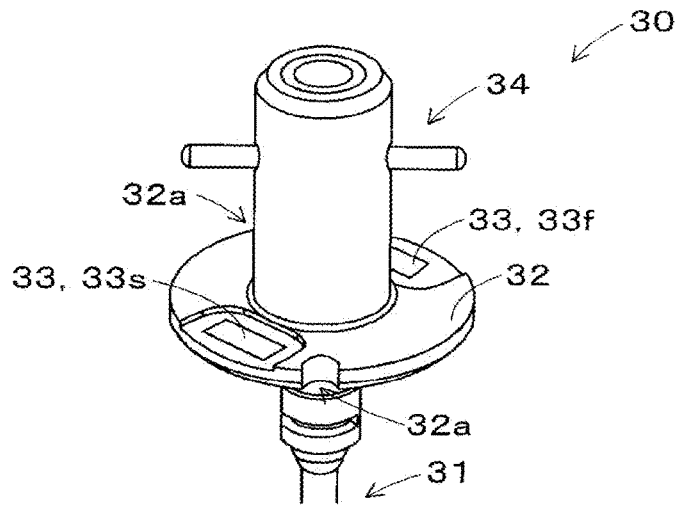
FIG. 2 is a perspective view showing a configuration example of a vicinity of flange section 32 of holding member 30.

As shown in FIG. 2, holding member 30 includes main body section 31, flange section 32, multiple (two in the present embodiment) identification sections 33, and gripping section 34. Main body section 31 is a portion configured to hold component 80 to be mounted on board 90 and actually includes a portion configured to hold component 80. For example, in the case of holding member 30 being a suction nozzle, main body section 31 includes a nozzle distal end portion (not shown) configured to pick up component 80 through suction. In the case of holding member 30 being a chuck, main body section 31 includes a claw section (not shown) configured to grip component 80.

Flange section 32 has, for example, a circular disk-like shape. In addition, multiple (two in the present embodiment) cutout sections 32a are provided at equal intervals in flange section 32. In the present embodiment, multiple (two) cutout sections 32a are provided at equal intervals in an outer circumferential portion of flange section 32. As will be described later, each of multiple (two) cutout sections 32a has such a shape that enables cutout section 32a in question to fit on angle defining member 17c which is provided on tool station 17. Further, in the present embodiment, for example, angle defining member 17c has a cylindrical shape, and each of multiple (two) cutout sections 32a has a semicircular shape as seen in an axial direction of holding member 30.

Multiple (two) identification sections 33 are provided so as to identify multiple (two in the present embodiment) accommodation angles. In the present embodiment, multiple (two) identification sections 33 are provided on one surface of two surfaces of flange section 32, the one surface being able to face shielding member 18, which will be described later. Multiple (two) identification sections 33 are preferably a character, a figure, a symbol, a three-dimensional shape, a color, or a combination thereof. For example, a characteristic portion of flange section 32 can be used for multiple (two) identification sections 33. For example, in the case that an identification code indicating unique information of holding member 30 is attached to flange section 32, multiple (two) identification sections 33 preferably includes the identification code. The identification code may be a one-dimensional code or a two-dimensional code.

In addition, in the case that a name of a manufacture, a model type of a product, a lot number, a character such as a mark indicating a compliance with a governing rule or standard, a figure, a symbol, and the like are affixed to flange section 32, multiple (two) identification sections 33 can include them. Further, in the case that a three-dimensional shape such as a recessed section, a projecting section, or the like is formed on flange section 32, multiple (two) identification sections 33 can include them. In the case that a color of a portion of the flange section 32 differs from that of another portion, multiple (two) identification sections 33 can include the color of the portion. Multiple (two) identification sections 33 can include a combination of two or more of the character, the figure, the symbol, the three-dimensional shape, and the color (referred to as a "combined identification section"). The combined identification section may be two or more of the combination of the character, the figure, the symbol, the three-dimensional shape, and the color, or may be those combined in a complex manner. For example, in the case that a name or the like of a manufacture is engraved on flange section 32, the resulting engraving can be a combined identification section in which the character, the figure, or the symbol is combined with the three-dimensional shape.

Component mounting head 20 can exchange holding member 30 that it holds for holding member 30 accommodated in tool station 17. Gripping section 34 is formed so as to be gripped by component mounting head 20 when removing holding member 30 accommodated in tool station 17. Gripping section 34 only needs to be gripped by component mounting head 20 and can take various forms. As shown in FIG. 2, gripping section 34 of the present embodiment is formed in such a manner as to project from main body section 31 in a direction orthogonal to the axial direction of holding member 30.

As part camera 14 or board camera 15, for example, a digital imaging device having an imaging element can be employed. As to the imaging element, for example, a charge-coupled device (CCD) or an image sensor such as a complementary metal-oxide-semiconductor (CMOS) can be used. Part camera 14 and board camera 15 perform capturing of the images based on the control signals received from control device 16. Image data of the images captured by part camera 14 and board camera 15 is transmitted to the control device 16.

Part camera 14 is fixed to a base of component mounting machine 10 in such a manner that an optical axis thereof is directed upwards in a Z-axis direction (vertically upwards). Part camera 14 can image the component 80 held by the holding member 30 from below. Board camera 15 is provided on moving table 132 of component transfer device 13 in such a manner that an optical axis is directed downwards in the Z-axis direction (vertically downwards). The board camera 15 can image substrate 90 from above.

Control device 16 includes a known central processing device and storage device, and a control circuit is configured therein (all of the described devices and circuit are not shown). The central processing device is CPU (Central Processing unit) and can perform various types of arithmetic processing. The storage device includes a first storage device and a second storage device. The first storage device is a volatile storage device (RAM: Random Access Memory), and the second storage device is a non-volatile storage device (ROM: Read Only Memory). Control device 16 receives, as an input, information, image data, and the like which are outputted from various types of sensors provided in component mounting machine 10. Control device 16 sends out a control signal to component transfer device 13 based on a control program and a predetermined mounting condition or the like which is set in advance.

Specifically, control device 16 causes holding member 30 to pick up (hold) component 80 supplied by component supply device 12, and causes part camera 14 to image holding member 30 holding component 80. Control device 16 performs image processing to the image captured by part camera 14 so as to recognize the holding posture of component 80 with respect to holding member 30. Control device 16 can recognize a holding orientation of component 80 by grasping a portion constituting a reference position for positioning, an external characteristic portion of component 80, and the like through image processing.

Control device 16 causes holding member 30 to move towards a position lying above a scheduled mounting position, which is set in advance by the control program or the like. In addition, control device 16 corrects the scheduled mounting position based on the holding orientation of component 80 to thereby set a mounting position where to actually mount component 80. The scheduled mounting position and the mounting position include a rotation angle in addition to a position (an X-axis coordinate and a Y-axis coordinate). Control device 16 corrects a target position (an X-axis coordinate and a Y-axis coordinate) and a rotation angle of holding member 30 so as to match the mounting position. Control device 16 causes holding member 30, for which the position (the X-axis coordinate and the Y-axis coordinate) and the rotation angle are corrected, to be lowered to thereby mount component 80 on board 90. Control device 16 repeats the pick-and-place cycle described above to thereby execute a mounting process of mounting multiple components 80 on board 90.

Tool station 17 is set within a movement range of component mounting head 20 and can detachably accommodate multiple (35 (=7×5) in the present embodiment) holding members 30. Additionally, shielding member 18 is provided on an upper surface of tool station 17. Tool station 17 includes multiple (35 in the present embodiment) accommodation recessed sections 17a, a support member 17b, and multiple (35 in the present embodiment) angle defining members 17c. FIG. 1 schematically shows entirely tool station 17, and FIGS. 3a and 3b show an example of an accommodated state of one holding member 30 in one accommodation recessed section 17a.

Multiple (35) accommodation recessed sections 17a are arranged at predetermined intervals so as to be formed into a dotted grid-like configuration with multiple rows (five rows in the present embodiment) in tool station 17. Multiple (35) accommodation recessed sections 17a are formed individually in an interior of tool station 17 and can accommodate therein main body sections 31 of corresponding holding members 30. Support member 17b has a plate-like shape and can support flange sections 32 of multiple (35) holding members 30. Each of multiple (35) angle defining members 17c fits in at least one cutout section 32a of multiple (two) cutout sections 32a in holding member 30 and causes holding member 30 in question to be accommodated as designed at one accommodation angle of multiple (two) accommodation angles. As shown in FIG. 3a, angle defining member 17c of the present embodiment has a circular cylindrical shape and fits in one cutout section 32a of multiple (two) cutout sections 32a in holding member 30. Cutout section 32a and angle defining member 17c can be fitted on and in each other in each of multiple (two) cutout sections 32a in holding member 30.

Shielding member 18 restricts holding member 30 accommodated in tool station 17 from being dislocated therefrom, for example, for example, when tool stations 17 are exchanged. Shielding member 18 is provided, for example, in slidable manner in a longitudinal direction of tool station 17 (the X-axis direction shown in FIG. 1 in the present embodiment). As shown in FIGS. 3a and 3b, shielding member 18 includes hole sections 18a in positions corresponding to accommodation recessed sections 17a. Hole section 18a is formed in such a manner as to extend along, for example, a sliding direction of the shielding member 18. Hole section 18a includes a large diameter section 18a1, which has a larger diameter than an outer diameter of the flange section 32 of holding member 30, and an extending section 18a2 which is narrower than the outer diameter of flange section 32 of holding member 30 and which extends along the sliding direction of shielding member 18.

Figure 3A:
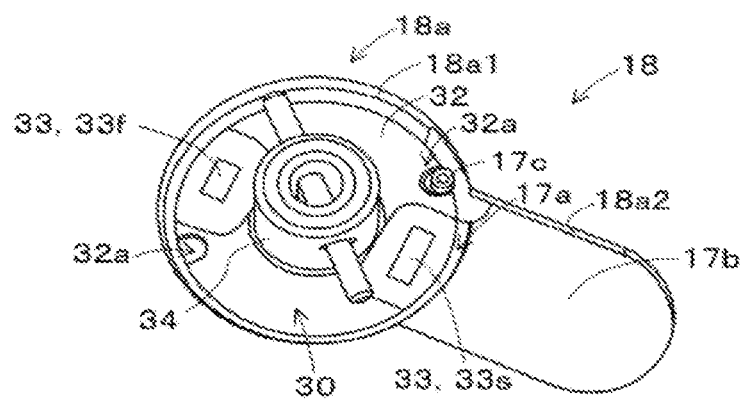
FIG. 3a is a perspective view showing an example of an accommodation state of holding member 30 in an open state.
Figure 3B:
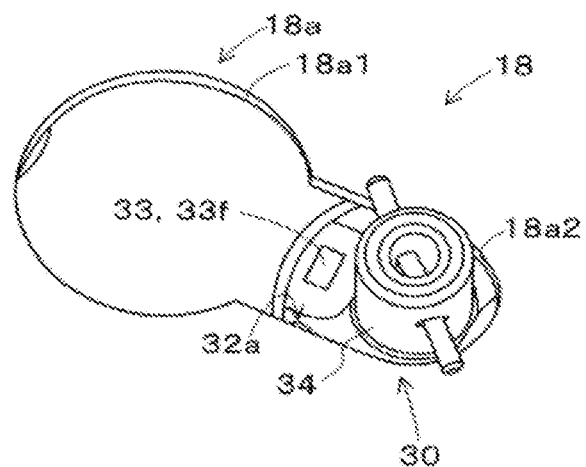
FIG. 3b is a perspective view showing an example of an accommodation state of holding member 30 in a close state.

As shown in FIG. 3a, in an open state in which shielding member 18 is slid to an open position, large diameter section 18a1 of hole section 18a faces oppositely flange section 32 of holding member 30, allowing main body section 31 of holding member 30 to be removed from corresponding accommodation recessed section 17a. As shown in FIG. 3b, in a close state in which shielding member 18 is slid to a close position, extending section 18a2 of hole section 18a faces oppositely flange section 32 of holding member 30, whereby flange section 32 of holding member 30 is prevented from being dislocated from corresponding accommodation recessed section 17a by shielding member 18 to thereby restrict holding member 30 from falling off from tool station 17. Shielding member 18 is driven to be opened and closed by a shielding member driving mechanism (not shown). The shielding member driving mechanism slides shielding member 18 to the open position, for example, while component mounting machine 10 is in operation, so as to permit accommodation and removal of holding member 30. For example, with component mounting machine 10 stopping its production process, in order to execute an exchange of tool stations 17, shielding member driving mechanism slides shielding member 18 to the close position to thereby restrict the accommodation and removal of holding members 30.

1-2. Control Example by Control Device 16

Figure 4A:
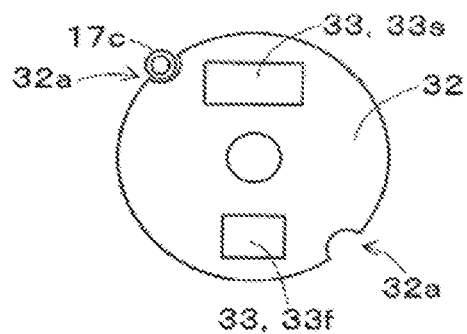
FIG. 4a is a schematic diagram showing an example of an accommodation angle of holding member 30.
Figure 4B:
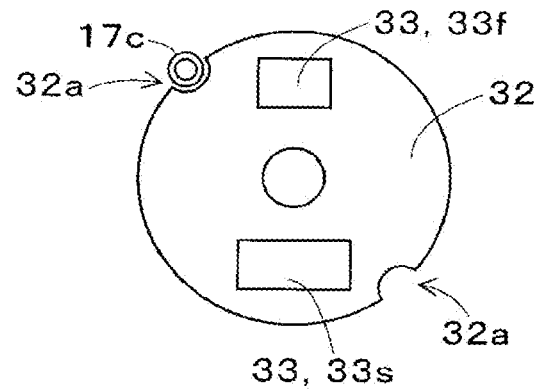
FIG. 4b is a schematic diagram showing another example of an accommodation angle of holding member 30.

As has been described heretofore, multiple (two) cutout sections 32a are provided in flange section 32 of holding member 30. To meet this configuration, multiple (two) accommodation angles exist in accommodating holding member 30 in tool station 17. FIG. 4a shows an example of an accommodation angle of holding member 30 when an accommodation state shown in FIGS. 3a and 3b results (hereinafter, referred to as a "predetermined accommodation angle"). As this occurs, one or first cutout section 32a of multiple (two) cutout sections 32a in holding member 30 fits on angle restricting member 17c. FIG. 4b shows an example of an accommodation angle of holding member 30 when an accommodation state results which differs from the accommodation state shown in FIGS. 3a and 3b. As this occurs, second cutout section 32a of multiple (two) cutout sections 32a in holding member 30 fits on angle defining section 17c.

Figure 5:
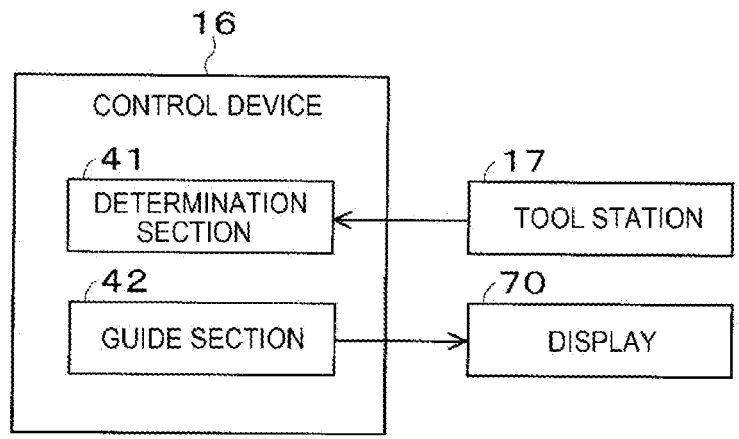
FIG. 5 is a block diagram showing an example of control blocks of control device 16.

In the case that holding member 30 is accommodated at the accommodation angle which differs from the predetermined angle, since there is a high possibility of failure to remove holding member 30 and mount component 80, component mounting machine 10 needs to recognize an angle difference in which the accommodation angle of holding member 30 differs from the predetermined accommodation angle. Control device 16 of component mounting machine 10 of the present embodiment can determine the angle difference in which the accommodation angle of holding member 30 accommodated in tool station 17 differs from the predetermined accommodation angle. In the case of control device 16 being regarded as a control block, control device 16 includes determination section 41. Control device 16 preferably includes further guide section 42. As shown in FIG. 5, control device 16 of the present embodiment includes determination section 41 and guide section 42.

1-2-1. Determination Section 41

As shown in FIG. 3a, in the open state, multiple (two) identification sections 33 are exposed. As shown in FIG. 3b, in the close state, one or first identification section 33, which is part of multiple (two) identification sections 33, is covered by shielding member 18, while second identification section 33 is exposed. In this way, in the close state in which part of multiple identification sections 33 is covered by shielding member 18, at least one identification section 33 which is exposed when the accommodation angle of holding member 30 is the predetermined accommodation angle is defined as first identification section 33f. In addition, at least one identification section 33 which differs from first identification section 33f is defined as second identification section 33s. As is clear from a comparison of FIG. 4a with FIG. 4b, in the case that the accommodation angle of holding member 30 differs from the predetermined accommodation angle, second identification section 33s is exposed in the close state. In addition, in the case that the number of identification sections 33 is three or more, at least either of first identification section 33f and second identification section 33s includes multiple identification sections 33.

Determination section 41 determines the angle difference in which the accommodation angle of holding member 30 differs from the predetermined accommodation angle. Specifically speaking, when determination section 41 cannot recognize first identification section 33f in the close state, determination section 41 attempts to recognize second identification section 33s, and when determination section 41 can recognize second identification section 33s in the close state, determination section 41 determines the angle difference. Additionally, first identification section 33f is preferably an identification code indicating unique information of holding member 30.

In the close state, determination section 41 can attempt to recognize first identification section 33f by using, for example, a reading device (not shown) provided on moving table 132 of component transfer device 13 shown in FIG. 1. In this case, determination section 41 issues an operation command to head driving device 131, causing head driving device 131 to move moving table 132, whereby the reading device is moved to a position lying above holding member 30 to be recognized. For example, in the case of first identification section 33f being an identification code indicating the unique information of holding member 30, determination section 41 causes the reading device not only to attempt to read the identification code but also to transmit whether it can read the identification code and the results of the reading to control device 16 (determination section 41). Additionally, determination section 41 can make use of board camera 15, which has been described before, as the reading device. In this case, determination section 41 similarly causes board camera 15 to move to the position lying above holding member 30 to be recognized. Determination section 41 causes board camera 15 to image first identification section 33f, and transmits the captured image data to control device 16 (determination section 41). Determination section 41 performs an image process to the image of first identification section 33f so as to attempt to recognize first identification section 33f.

Determination section 41 determines that holding member 30 is accommodated in tool station 17 at the accommodation angle which is the predetermined accommodation angle when determination section 41 can recognize first identification section 33f in the close state. Determination section 41 attempts to recognize second identification section 33s similarly as when it recognizes first identification section 33f when determination section 41 cannot recognize first identification section 33f in the close state. Determination section 41 determines the angle difference in which the accommodation angle of holding member 30 differs from the predetermined accommodation angle when determination section 41 can recognize second identification section 33s in the close state.

Determination section 41 can acquire in advance a relationship between the arrangement of multiple (two) cutout sections 32a in flange section 32 and the arrangement of multiple (two) identification sections 33 on flange section 32. Thus, when determination section 41 can recognize second identification section 33s in the close state, determination section 41 can calculate an accommodation angle of holding member 30 based on the position of second identification section 33s in question on flange section 32. What has been described heretofore can be true with a case in which multiple second identification sections 33s are provided.

In the present embodiment, holding member 30 includes flange section 32. Additionally, with flange section 32 supported by support member 17b of tool station 17 and main body section 31 accommodated in the interior of tool station 17, multiple (two) identification sections 33 are provided on the first surface of flange section 32 defined on a side thereof which faces shielding member 18. As a result, tool station 17 can form the open state or the close state in accordance with an open or close state of shielding member 18.

Further, flange section 32 includes multiple (two) cutout sections 32*a*. Then, angle defining member 17*c* fits in at least one or first cutout section 32*a* of multiple (two) cutout sections 32*a*, causing holding member 30 to be accommodated at one or first accommodation angle of multiple (two) accommodation angles. As a result, tool station 17 can detachably accommodate holding member 30 at the first accommodation angle of multiple (two) accommodation angles.

Furthermore, multiple (two) identification sections 33 are the character, figure, symbol, three-dimensional shape, color, or the combination thereof. As a result, determination section 41 can identify multiple (two) accommodation angles by a simple and easy means such as, for example, reading by the reading device or imaging by the camera. First identification section 33*f* is the identification code indicating the unique information of holding member 30. As a result, component mounting machine 10 can attempt to first recognize the identification code in the close state. When it can recognize the identification code, component mounting machine 10 can acquire the coincidence of the accommodation angle at which holding member 30 is accommodated in tool station 17 with the predetermined accommodation angle and the unique information of holding member 30.

1-2-2. Guide Section 42

When determination section 41 determines the angle difference, guide section 42 causes display 70 to display information notifying that the accommodation angle of holding member 30 differs thereon, guiding a correction of the accommodation angle of holding member 30 in question. Guide section 42 preferably display the position of holding member 30 for which determination section 41 determines the angle difference in tool station 17 together with the information notifying that the accommodation angle of holding member 30 in question differs. Display 70 only needs to display these pieces of information and hence can take various forms. For example, a display device for displaying a production status of component mounting machine 10 shown in FIG. 1 can be used for display 70. Display 70 may be a known display device (for example, a liquid crystal display or the like) that is provided separately.

According to the present embodiment, when determination section 41 determines the angle difference, guide section 42 causes display 70 to display the information notifying that the accommodation angle of holding member 30 differs, guiding the correction of the accommodation angle of holding member 30 in question. As a result, the operator who operates component mounting machine 10 can be aware that the accommodation angle of holding member 30 accommodated in tool station 17 differs from the predetermined accommodation angle, whereby the operator can correct the accommodation angle of holding member 30 in question.

1-3. Modified Example

Figure 6:
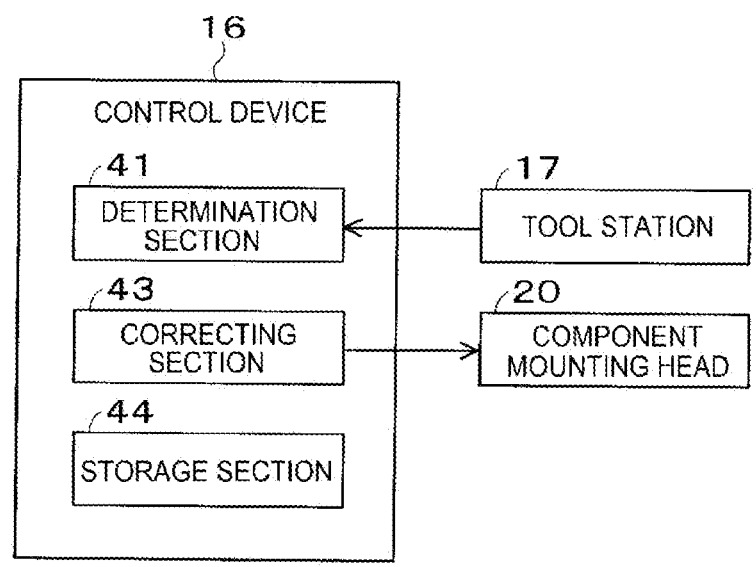
FIG. 6 is a block diagram showing another example of control blocks of control device 16.

When regarded as a control block, control device 16 of the present embodiment includes determination section 41 and correction section 43. Control device 16 preferably includes further storage section 44. As shown in FIG. 6, control device 16 of the present embodiment includes determination section 41, correction section 43, and storage section 44. Determination section 41 of the present modified example is the same as determination section 41 of the first embodiment that has been described above.

1-3-1. Correction Section 43

When determination section 41 determines the angle difference and holding member 30 is removed from tool station 17, correction section 43 causes holding member 30 in question to be removed at a corrected angle resulting from rotating holding member 30 an angle difference between the actual accommodation angle and the predetermined accommodation angle from the predetermined accommodation angle. For example, a case may be assumed such that holding member 30 is accommodated at the accommodation angle shown in FIG. 4*b* in tool station 17. At this time, since the accommodation angle of holding member 30 differs from the predetermined accommodation angle, determination section 41 determines the angle difference for holding member 30 in question. As described above, determination section 41 can calculate an accommodation angle of holding member 30 from the position of second identification section 33*s* when determination section 41 has been able to recognize second identification section 33*s* in question in the close state. In this case, determination section 41 calculates an angle resulting from rotating holding member 30 an angle of 180° from the predetermined accommodation angle as the actual accommodation angle.

For example, when component mounting head 20 removes holding member 30 from tool station 17, correction section 43 causes component mounting head 20 to remove holding member 30 in question at a corrected angle resulting from rotating holding member 30 in question an angle difference between the actual accommodation angle and the predetermined accommodation angle from the predetermined accommodation angle. In this case, the angle difference between the actual accommodation angle and the predetermined accommodation angle is 180°. Therefore, correction section 43 causes component mounting head 20 to remove holding member 30 in question at the corrected angle resulting from rotating holding member 30 in question the angle corresponding to 180° from the predetermined accommodation angle.

According to the present modified example, when determination section 41 determines the angle difference and holding member 30 is removed from tool station 17, correction section 43 causes holding member 30 in question to be removed at the corrected angle resulting from rotating holding member 30 in question the angle difference between the actual accommodation angle and the predetermined accommodation angle from the predetermined accommodation angle. As a result, when the accommodation angle of holding member 30 accommodated in tool station 17 differs from the predetermined accommodation angle, component mounting machine 10 can remove holding member 30 in question at the corrected angle in accordance with the actual accommodation angle.

1-3-2. Storage Section 44

Storage section 44 stores an accommodation position of holding member 30 in tool station 17 and an actual accommodation angle of holding member 30 in question in an associated fashion. Correction section 43 preferably sets a correction angle by use of the accommodation angle stored in storage section 44.

As described above, when holding member 30 for which determination section 41 determines the angle difference is removed from tool station 17, correction section 43 needs to set a correction angle based on the actual accommodation angle. For this reason, storage section 44 is preferably provided which stores the position of holding member 30 in tool station 17 and the actual accommodation angle of holding member 30 in question in the associated fashion. In this case, correction section 43 can set a correction angle by reading out the accommodation angle stored in storage section 44. A non-volatile storage device (not shown) needs to be used for storage section 44.

With this modified example, storage section 44 stores the accommodation position of holding member 30 in tool station 17 and the actual accommodation angle of holding member 30 in question in the associated fashion. Additionally, correction section 43 sets the correction angle by use of the accommodation angle stored in storage section 44. As a result, when removing holding member 30 for which determination section 41 determines the angle difference from tool station 17, component mounting machine 10 can omit the calculation of an actual accommodation angle.

2. Second Embodiment

Component mounting machine 10 of the present embodiment includes a similar configuration to that of component mounting machine 10 described in the first embodiment. However, holding member 30 only needs to include at least one identification section 33. Therefore, in the present embodiment, in a close state in which at least a part of at least one identification section 33 is covered by shielding member 18, at least one identification section 33 which is exposed when an accommodation angle of holding member 30 is a predetermined accommodation angle is defined as first identification section 33$f$.

In addition, determination section 41 of the present embodiment differs from determination section 41 described in the first embodiment. In the present embodiment, when determination section 41 cannot recognize first identification section 33$f$ in the close state, determination section 41 attempts to recognize first identification section 33$f$ by shifting shielding member 18 to provide an open state in which the covering of identification section 33 at the at least a part of at least one identification section 33 by shielding member 18 is released, and when determination section 41 can recognize first identification section 33$f$ in the open state, determination section 41 determines an angle difference.

Determination section 41 can attempt to recognize first identification section 33$f$ in the close state as in the case with the first embodiment. Determination section 41 determines that holding member 30 is accommodated in tool station 17 at the accommodation angle which is the predetermined accommodation angle when determination section 41 can recognize first identification section 33$f$ in the close state. When determination section 41 cannot recognize first identification section 33$f$ in the close state, determination section 41 shifts the state of identification state 33 from the close state to the open state and attempts to recognize first identification section 33$f$. Determination section can attempt to recognize first identification section 33$f$ in the open state similarly as when determination section 41 attempts to recognize first identification section 33$f$ in the close state. When determination section can recognize first identification section 33$f$ in the open state, determination section 41 determines an angle difference in which the accommodation angle of holding member 30 differs from the predetermined accommodation angle. Determination section 41 can also calculate an accommodation angle of holding member 30 similarly as in the case with the first embodiment. In either of the embodiments and the modified example, too, determination section 41 can drive shielding member 18 to be opened or closed by use of the shielding member driving mechanism described above so as to form the open state or the close state.

Also, in the present embodiment, control device 16 preferably includes further guide section 42. In addition, as with the modified example of the first embodiment, control device 16 can also include at least correction section 43 of correction section 43 and storage section 44. Further, also in the present embodiment, first identification section 33$f$ is preferably an identification code indicating unique information of holding member 30.

3. Others

Figure 7:
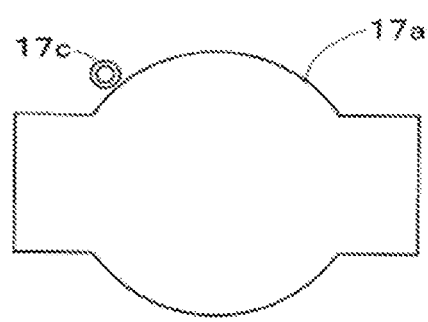

In the embodiments and the modified example, holding member 30 is described as being made up of a suction nozzle. However, the embodiments and the modified example can similarly be applied to a case in which holding member 30 is made up of a chuck. However, in the case of holding member 30 being made up of a chuck, main body section 31 includes a claw section configured to grip component 80, and hence, compared with the case in which holding member 30 is made up of the suction nozzle, main body section 31 is enlarged in size. For this reason, in the case of holding member 30 being made up of a chuck, as shown in FIG. 7, accommodation recessed section 17$a$ of tool station 17 needs to be formed into such a shape that enables main body section 31 to pass therethrough. This will also be true with large diameter section 18$a$1 of shielding member 18. By forming accommodation recessed section 17$a$ and large diameter section 18$a$1 into shapes matching the case in which holding member 30 is made up of a chuck, accommodation recessed section 17$a$ and large diameter section 18$a$1 can also be applied to the case in which holding nozzle 30 is made up of the suction nozzle, increasing the versatility thereof.

4. Control Method for Component Mounting Machine 10

What has been described about component mounting machine 10 can also be regarded as a control method for component mounting machine 10. Specifically speaking, the control performed by determination section 41 corresponds to a determination step. The control performed by guide section 42 corresponds to a guide step. The control performed by correction section 43 corresponds to a correction step. The control performed by storage section 44 corresponds to a storage step. Also, with the control method for component mounting machine 10, the same operation and effect as those described for component mounting machine 10 can be obtained.

5. Examples of Effects of Embodiments

With component mounting machine 10 of the first embodiment, when determination section 41 cannot recognize first identification section 33$f$ in the close state, determination section 41 attempts to recognize second identification section 33$s$, and when determination section 41 can recognize second identification section 33$s$ in the close state, determination section 41 determines the angle difference. With component mounting machine 10 of the second embodiment, when determination section 41 cannot recognize first identification section 33$f$ in the close state, determination section 41 attempts to recognize first identification section 33$f$ by shifting the state of identification section 33 from the close state to the open state, and when determination section 41 can recognize first identification section 33*f* in the open state, determination section 41 determines the angle difference. With both of component mounting machines 10, determination section 41 can determine the angle difference in which the accommodation angle of holding member 30 accommodated in tool station 17 differs from the predetermined accommodation angle.

REFERENCE SIGNS LIST

10: Component mounting machine, 17: Tool station, 17*b*: Support member, 17*c*: Angle defining member, 18: Shielding member, 30: Holding member, 31: Main body section, 32: Flange section, 32*a*: Cutout section, 33: Identification section, 33*f*: First identification section, 33*s*: Second identification section, 41: Determination section, 42: Guide section, 43: Correction section, 44: Storage section, 70: Display, 80: Component, 90: Board.

The invention claimed is:

1. A component mounting machine comprising:
a tool station detachably accommodating a holding member having a main body section configured to hold a component to be mounted on a board and multiple identification sections configured to identify multiple accommodation angles; and
a determination section configured to determine an angle difference of the accommodation angle of the holding member, of which angle being different from a predetermined accommodation angle,
wherein at least one identification section of the multiple identification sections is defined as a first identification section, the at least one identification section being exposed when the accommodation angle of the holding member is the predetermined accommodation angle in a close state in which a part of the multiple identification sections are covered by a shielding member, and
wherein when the determination section does not recognize the first identification section in the close state, the determination section attempts to recognize a second identification section, which is at least one identification section of the multiple identification sections different from the first identification section, and the determination section determines the angle difference when the determination section recognizes the second identification section in the close state.

2. The component mounting machine according to claim 1,
wherein the holding member further comprises a guide section causing a display to display a notification notifying that the accommodation angle of the holding member differs, when the determination section determines the angle difference, so that a correction of the accommodation angle of the holding member is notified.

3. The component mounting machine according to claim 1,
wherein the holding member further comprises a correction section configured, when the determination section determines the angle difference and the holding member is to be removed from the tool station, to cause the holding member to be removed at a corrected angle, of which angle being rotated from the predetermined accommodation angle for a degree of a difference between the actual accommodation angle and the predetermined accommodation angle.

4. The component mounting machine according to claim 3, further comprising:
a storage section storing an accommodating position of the holding member in the tool station and the actual accommodation angle of the holding member in an associated fashion,
wherein the correction section sets the corrected angle based on the accommodation angle that the storage section stores.

5. The component mounting machine according to claim 1,
wherein the holding member further comprises a flange section, and
wherein the identification section is provided on a first surface of the flange section defined on a side of the flange section which faces the shielding member in such a state that the flange section is supported by a support member of the tool station and that the main body section is accommodated in an interior of the tool station.

6. The component mounting machine according to claim 5,
wherein the flange section comprises multiple cutout sections, and
wherein the tool station comprises an angle defining member configured to fit on at least one cutout section of the multiple cutout sections to thereby cause the holding member to be accommodated at one accommodation angle of the multiple accommodation angles.

7. The component mounting machine according to claim 1,
wherein the identification section is a character, a figure, a symbol, a three-dimensional shape or a color, or a combination thereof.

8. The component mounting machine according to claim 7,
wherein the first identification section is an identification code indicating unique information of the holding member.

* * * * *